United States Patent [19]
Ferrell

[11] Patent Number: 5,653,045
[45] Date of Patent: Aug. 5, 1997

[54] METHOD AND APPARATUS FOR DRYING PARTS AND MICROELECTRONIC COMPONENTS USING SONIC CREATED MIST

[76] Inventor: Gary W. Ferrell, 608 Terrace Ave., Half Moon Bay, Calif. 94019

[21] Appl. No.: 484,921

[22] Filed: Jun. 7, 1995

[51] Int. Cl.$^6$ ............................................. F26B 5/00
[52] U.S. Cl. ................................. 34/341; 34/352
[58] Field of Search ................... 34/337, 339, 341, 34/343, 348, 352, 279, 516, 78; 134/902

[56] References Cited

U.S. PATENT DOCUMENTS

| | | |
|---|---|---|
| 4,577,650 | 3/1986 | McConnell . |
| 4,615,760 | 10/1986 | Dressler . |
| 4,633,893 | 1/1987 | McConnell et al. . |
| 4,738,272 | 4/1988 | McConnell . |
| 4,740,249 | 4/1988 | McConnell . |
| 4,777,970 | 10/1988 | Kusuhara ................ 134/902 |
| 4,778,532 | 10/1988 | McConnell et al. . |
| 4,795,497 | 1/1989 | McConnell et al. . |
| 4,813,851 | 3/1989 | Chun et al. . |
| 4,856,444 | 8/1989 | McConnell . |
| 4,899,767 | 2/1990 | McConnell et al. . |
| 4,899,768 | 2/1990 | Yatbe ................ 134/902 |
| 4,911,761 | 3/1990 | McConnell et al. . |
| 4,917,123 | 4/1990 | McConnell et al. . |
| 4,984,597 | 1/1991 | McConnell et al. . |
| 5,105,557 | 4/1992 | Vadasz et al. ................ 34/14 |
| 5,226,242 | 7/1993 | Schwenkler ................ 34/78 |
| 5,351,419 | 10/1994 | Franka et al. ................ 34/470 |
| 5,351,449 | 10/1994 | Franka et al. . |
| 5,383,484 | 1/1995 | Thomas et al. . |
| 5,494,526 | 2/1996 | Paranjpe ................ 134/902 |
| 5,520,744 | 5/1996 | Fujikawa et al. ................ 134/902 X |
| 5,535,525 | 7/1996 | Gardner ................ 34/78 |
| 5,536,525 | 7/1996 | Gardner . |

OTHER PUBLICATIONS

L.E.Scriven and C.V. Sternling, "The Marangoni Effects," Nature, 16 Jul. 1960, pp. 186–188.

Primary Examiner—Edward K. Look
Assistant Examiner—Michael S. Lee
Attorney, Agent, or Firm—Frank G. Rushford

[57] ABSTRACT

An apparatus and method for drying single or multiple parts or objects wherein the apparatus uses a drying chamber for containing said object or objects, said drying chamber having a closeable entryway for providing access to said drying chamber, the use of a sonic head disposed in said drying chamber attached to a source of drying liquid and an adjustable supply and drain attached to said drying chamber for introducing and removing said drying fluid to and from said drying chamber.

12 Claims, 9 Drawing Sheets

METHOD AND APPARATUS FOR DRYING PARTS AND MICROELECTRONIC COMPONENTS USING SONIC CREATED MIST

BACKGROUND OF THE INVENTION

1. Field of the Invention

The present invention relates to the drying of manufactured parts for further assembly, including microelectronics components including the fabrication of integrated circuits, and specially to a process and system for drying integrated circuit wafers using mist or fog of a drying liquid such as isopropyl alcohol (IPA) droplets, which substantially reduces the metallic, particle and organic contamination of the integrated circuit wafers during planar processing.

2. Description of the Prior Art

While the drying of component parts after cleaning or a process and system for drying integrated circuit wafers, using medical instruments through computer displays, the highest degree of criticality of drying and cleaning has the greatest need in the microelectronics industry, specially in the fabrication of integrated circuits.

For the past 25 years, a huge research and development effort has been directed to the production of integrated circuits. Much of this effort has been directed to the development of the planar processing is a general concern in all industries from optics, sequence of steps carried out on the surface of a semiconductor wafer. More particularly, the planar process involves the proper sequencing and repetition of the steps of oxidation, patterning, dopant-addition and dopant diffusion, which results in the selective introduction of p- and n-type dopant atoms into specific regions on the surface of the wafer. The introduction of the dopant atoms into specific regions of the wafer surface is the basis for the formation of active and passive devices having ever decreasing dimensions.

From a processing standpoint, the key steps in the planar process are: 1) the formation of a masking oxide layer; 2) the selective removal or etching of the oxide layer; 3) the deposition of the dopant atoms on or near the wafer surface; and 4) the diffusion of the dopant atoms into the wafer surface. As described below, many of these steps are performed as "wet" processes, so called because the steps involve immersing the wafer in various acids and other solutions. In addition, there are typically a number of cleaning steps performed between the key steps, with these cleaning steps also being wet processes.

The following discussion focuses on the planar processing of silicon integrated circuits. However, similar processing steps are used for gallium arsenide and other semiconductor materials. Two important advantages of silicon are its good semiconducting properties (i.e., its intrinsic-carrier concentration versus dopant density), and the ability to form on silicon a stable, controllable silicon dioxide film that has excellent chemical properties. Indeed, the chemical properties of the silicon-silicon dioxide system allow for the selective etching of the silicon and the oxide, and for the doping of specific regions of the silicon. Both of these chemical properties are key to producing dense arrays of semiconductor devices on a single wafer.

The first step in producing silicon integrated circuits is the production of large, high quality silicon crystals. The crystals must also be of very high-purity; typically only about one unintentional, electrically active impurity atom pure billion silicon atoms can be tolerated. The crystals are initially formed from silicon dioxide and carbon in a high temperature (about 2000 degrees Centigrade) electric arc furnace, which produces a metallurgical-grade silicon. This metallurgical-grade silicon is then converted to trichlorosilane which is, in turn, reduced by hydrogen to form high-purity, polysilicon semiconductor-grade silicon.

The semiconductor-grade silicon is then formed into a large, nearly perfect single crystal using either the Czochralski (CZ) method or the float-zone (FZ) method. The CZ method involves melting the polysilicon in a fused-silica crucible in an inert gas atmosphere (such as argon), then inserting a high-quality seed crystal in the melt. The seed is slowly pulled from the melt while rotating, thus producing a large, single crystal ingot of silicon. By contrast, in the FZ method a rod of cast polycrystalline silicon is held in a vertical position and slowly rotated while a melted region is slowly passed from the bottom of the rod to the top.

Once the single silicon crystal has been grown, it is sliced with a diamond saw into thin wafers. Each wafer is then polished and chemically etched until a mirror-like surface is obtained. Marks may also added to the edge of the wafer to indicate the orientation of the crystal structure. After the wafers have been formed and polished, the actual planar process begins.

The first step of the planar process is the growth of an oxide layer of about 20 nanometers to 1 micrometer in thickness on the surface of the wafer. The oxide layer is typically grown either by thermal oxidation or deposition, with thermally grown oxides generally of a higher quality than deposited oxides. In order to maintain the, stability of the electrical properties of the interface between the silicon and the oxide, the numbers of organic or metallic on the surface and in the oxide impurities must be kept to a minimum.

The thermal oxide is formed by placing the wafer inside a resistance-heated furnace having a temperature in the range of 850 to 1100 degrees Centigrade. The oxidizing agent can be dry oxygen or it can contain water mist or fog, with oxidation proceeding more rapidly in the latter environment. Since oxidation takes place at the silicon-silicon dioxide interface, the oxidizing agent must diffuse through any previously formed oxide and then react with the silicon surface. In fact, for lower temperatures and thinner oxides, the oxide thickness is a linear function of the oxidation time. However, at higher temperatures and for thicker oxides, the oxide thickness is proportional to the square root of the oxidation time. This provides a practical upper limit on the thickness of oxides which can be obtained.

After the oxide layer has been formed, the second step of the planar process involves the selective etching of the oxide is performed to expose areas of the silicon where dopant atoms are to be introduced. The selective removal is accomplished using a light-sensitive polymer material called a resist, in a process called photolithography. The oxidized wafer is lightly coated with the liquid resist and then the resist is dried. A partially transparent photomask is then placed on the wafer and aligned using a microscope. The wafer is then exposed to ultraviolet light, which changes the chemical structure of the portions of the resist which are not shielded by the photomask. Finally, the exposed portions of the resist are then selectively dissolved using a solvent such as trichloroethylene.

Note that as the minimum feature size of semiconductor devices approaches the wavelength of the ultraviolet light, diffraction can limit the available resolution when using conventional photoplithography. In order to overcome this limitation, alternatives to conventional photolithography have been developed. Two of these advanced approaches are electron-beam lithography and x-ray lithography, the latter in which the greatest progress has been made to date.

Electron-beam lithography uses a focused stream of electrons to deliver exposure energy to the resist. More particularly, the electron beam is deflected to expose the desired pattern sequentially, so that a mask is not needed. In order to control the deflection, the information needed to deflect the electron beam is stored in a computer. Additionally, the electron beam can be finely focused to a size much smaller than the minimum feature size an moved across the surface of the wafer, or the beam can be formed into a rectangular shape and the pattern built up by repeated block-like exposures.

After the photomask pattern has been formed in the resist, the unprotected portions of the oxide are chemically etched to transfer the pattern to the silicon wafer. The chemical etching may be accomplished by dissolving the unprotected portions of the oxide using hydrofluoric acid, resulting in the exposure of corresponding portions of the silicon wafer. The resist is then removed from the remaining portions of the oxide by "ashing", in which the resist is burned off in a plasma chamber under vacuum.

Once the remaining portions of the resist have been removed, the dopant atoms are added to the exposed portions of the silicon wafer. The resulting dopant profile, or distribution of dopant atoms, is primarily determined by steps three and four of the planar process. In step three, the dopant atoms are placed on or near the surface of the wafer by liquid coating, ion implantation or gaseous deposition. The fourth step involves transporting the dopant atoms into the wafer using a process called drive-in diffusion. Note that the shape of the resulting .dopant distribution is determined by the method of dopant placement, while the diffusion depth depends primarily on the temperature and time of the drive-in diffusion.

A major concern throughout the planar fabrication process is in eliminating contamination. Specifically, the current goal of modern integrated circuit processing is to produce wafers having less than four particles of contamination per wafer, with each particle being less than 0.5 micron in diameter. Of particular concern is the fine organic ash that remains on the wafer surface following conventional or electron-beam photolithography and ashing.

Following the lithography and ashing steps, the wafer is cleaned using the following cleaning process. First, a hot sulfuric acid/hydrogen peroxide wash is used to remove organic contamination. The hot sulfuric acid/hydrogen peroxide wash is followed by an ammonium hydroxide/ hydrogen peroxide rinse to remove non-metallic particles, and then a hydrochloric acid/hydrogen peroxide rinse to remove any metallic particles introduced by the high ph (approximately 12) of the ammonium hydroxide/hydrogen peroxide rinse.

After cleaning, the wafer is dried using either a conventional spin rinse dryer (SRD) or isopropyl alcohol (IPA) mist or fog system. In particular, conventional IPA mist or fog systems are capable of producing a wafer having a very dry surface finish and very low particle contamination count. For the drying process, the wafer is transferred from the cleaning vessel to a self-contained drying module. A pressurized IPA stream is directed to a heated plate which is located in the drying module, in order to produce a hot IPA mist or fog which dries the wafer. However, the hot IPA mist or fog produced by the stream and hot plate is highly flammable, thus requiring special safety precautions to avoid fires.

Accordingly, there is a need for a method and apparatus for drying wafers during the production of integrated circuits which does not require the use of a self-contained drying module, which does not result in flammable mist or fogs, which reduces the usage of expensive chemicals, and in which ultrasonic vibrations are used to improve the efficiency and increase the throughput of the overall drying process.

Additionally, the use of the present invention for the drying of complex parts and components for optical, automotive, aerospace or where drying simple or complex component parts can be accomplished with a minimum use of chemicals and time.

SUMMARY OF THE INVENTION

The present invention provides a novel method and apparatus for drying component parts and other articles of manufacture, including semiconductor wafers used in fabricating integrated circuits. The method and apparatus of the present invention may be used in the processing all parts where exposure to the drying liquid used does not have a detrimental affect on the item dried.

In a preferred embodiment, the method of the invention involves placing the wafers to be dried in a sealed drying chamber constructed of stainless steel or similar material. The surfaces of the wafers are oriented vertically using a conventional quartz wafer boat. The drying chamber is then flooded with dry nitrogen which purges the chamber of any airborne contaminants or other particles. The drying chamber is then filled with ultrapure de-ionized water to a level which just covers the top edges of the wafers.

Once the wafers have been immersed in the de-ionized water, nitrogen-pressurized isopropyl alcohol (IPA) flows to a sonic head which is attached to the top of the drying chamber. The sonic head, which vibrates at about 100 kilohertz, produces an IPA mist or fog of ultrafine droplets having an average diameter of 20 microns. A low-velocity nozzle which is coupled to the sonic head distributes the droplets into the drying chamber.

The manner in which the droplets are distributed into the drying chamber is very important. Specifically, the size, velocity and distribution of the droplets must be Carefully controlled in order to build a non-mixing IPA film on the surface of the de-ionized water. Thus, the sonic head and nozzle must produce ultrafine droplets having a very low velocity which can be controlled with a low velocity gas jet.

As the IPA mist or fog is formed it settles on the surface of the de-ionized water and forms a film which partially diffuses into the water. The flow of IPA must be great enough to build the film faster than it diffuses into the water. Once the film has been built, the de-ionized water is slowly drained from the drying chamber So that the IPA film is pulled onto the surface of the wafers. More particularly, the low surface tension of the IPA film forces the de-ionized water from the surface of the wafers in a uniform sheet, leaving only a small amount of IPA film on the surface of the wafers.

After the de-ionized water has been completely drained from the drying chamber, hot nitrogen is introduced into the drying chamber to ensure drying of the wafers.

The present invention also includes an apparatus for drying integrated circuit wafers, comprising a stainless steel drying chamber having a lid for providing access to the chamber. A sonic head and low-velocity nozzle is attached to the lid so that the nozzle protrudes into the drying chamber. The sonic head is fed by a source of IPA which is pressurized by low-pressure nitrogen. Also attached to the lid is are valves for introducing ambient temperature nitrogen for purging, and hot nitrogen for drying. An adjustable flowmeter and drain is attached to the bottom of the drying chamber for introducing and removing de-ionized water to and from the drying chamber.

Further features and advantages of the present invention will be appreciated by a review of the following detailed description of the preferred embodiments taken in conjunction with the following drawings.

BRIEF DESCRIPTION OF THE DRAWINGS

The present invention may be best understood by referring to the following detailed description of the preferred embodiments and the accompanying drawings, wherein like numerals denote like elements and in which.

DETAILED DESCRIPTION OF THE PREFERRED EMBODIMENTS

The following exemplary discussion focuses on the planar processing of silicon integrated circuits, with emphasis on the control and elimination of contaminants during each processing step. Indeed, a substantial portion of the total processing time and effort is directed to steps and procedures for cleaning, purifying or otherwise eliminating contamination. More importantly, as the physical size and packing density of individual semiconductor devices becomes smaller, the need to control and eliminate contaminates during fabrication increases.

The first step in producing silicon integrated circuits is the production of large, high quality silicon crystals. The crystals must also be of very high-purity. For example, a typical semiconductor-grade crystal averages only about one unintentional, electrically active impurity atom pure billion silicon atoms. High-purity silicon is produced from silicon dioxide and elemental carbon in a high temperature (about 2000 degrees Centigrade) electric arc furnace, where the carbon reduces the silicon dioxide to elemental silicon. The elemental silicon then condenses to about 90 percent pure, metallurgical-grade silicon. This metallurgical-grade silicon is then converted to trichlorosilane which is, in turn, purified by distillation. Finally, the purified trichlorosilane is reduced by hydrogen to form high-purity, polysilicon semiconductor-grade silicon 103 (see FIGS. 1(a)-1(b)).

Figure 1A:
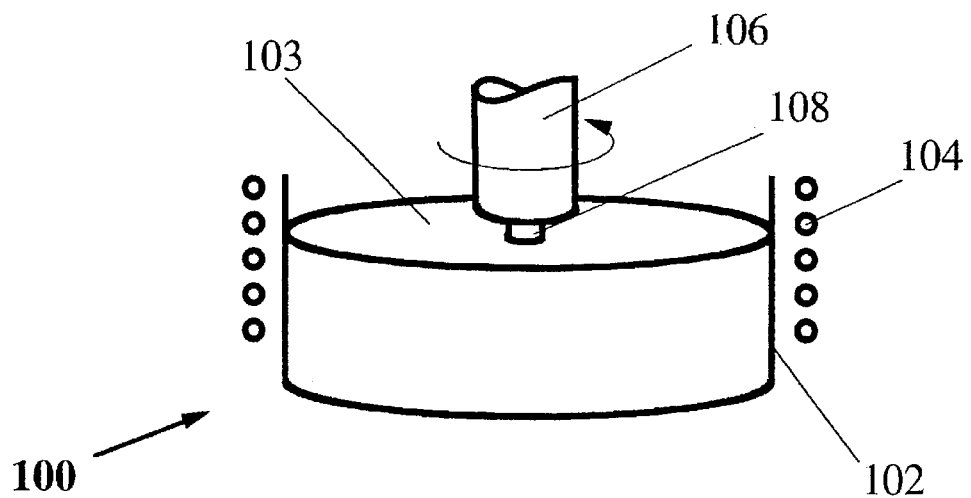
FIGS. 1(a) and 1(b) illustrate a conventional apparatus for producing single-crystal semiconductor ingots using the CZ method.
Figure 1B:
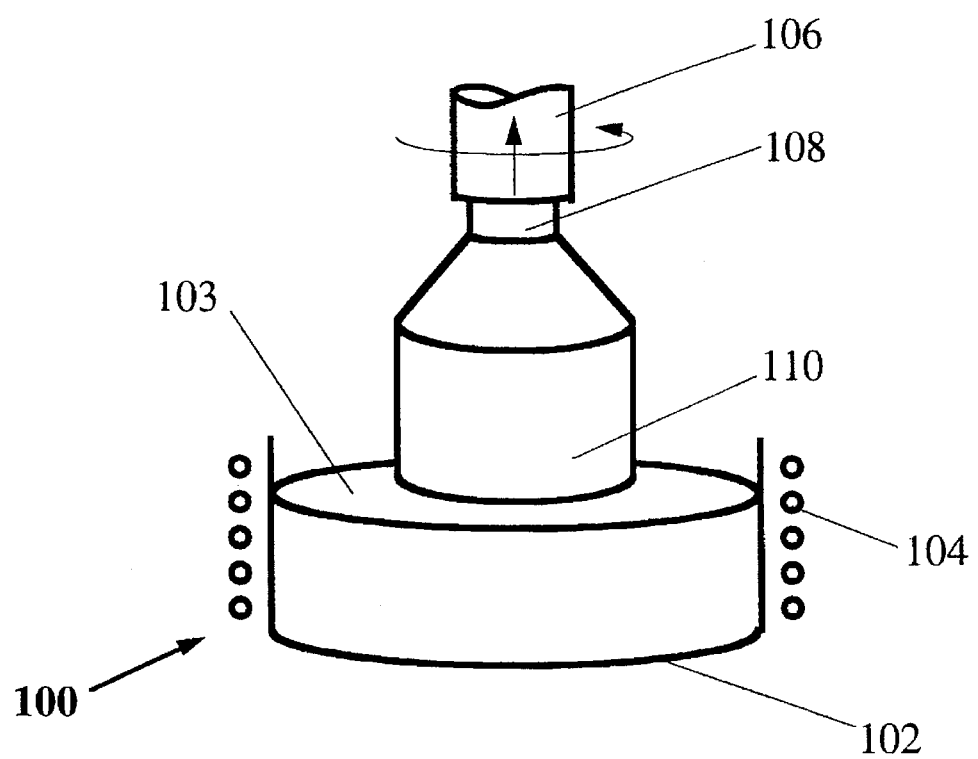

The polysilicon semiconductor-grade silicon 103 is then formed into a large, nearly perfect single crystal ingot using either the Czochralski (CZ) method or the float-zone (FZ) method. Referring to FIGS. 1(a) and 1(b), an apparatus 100 for producing single-crystal semiconductor ingots using the CZ method is shown. As shown in FIGS. 1(a) and 1(b), apparatus 100 includes a fused-silica crucible 102 surrounded by heating coils 104, the latter which are used to hold crucible 102 at a temperature of just above 1412 degrees Centigrade. A rotating support member 106 is used to hold a high-quality seed crystal 108 which a desired crystalline orientation, and to lower and raise seed crystal 108 to and from crucible 102.

The CZ method involves melting the semiconductor-grade silicon 103 in crucible 102 under an inert gas atmosphere (such as argon), then lowering seed crystal 108 in the melt using rotating support member 106. Seed crystal 108 is then is slowly pulled from the melt continuing the rotation, thus producing a large, single crystal ingot of silicon 110. By carefully controlling the growth conditions, new silicon atoms are added to ingot 110 in a manner which continues the crystal structure of seed crystal 108. Additionally, a desired diameter for ingot 110 is obtained by feedback control of the pull rate and temperature of the melt.

Figure 2:
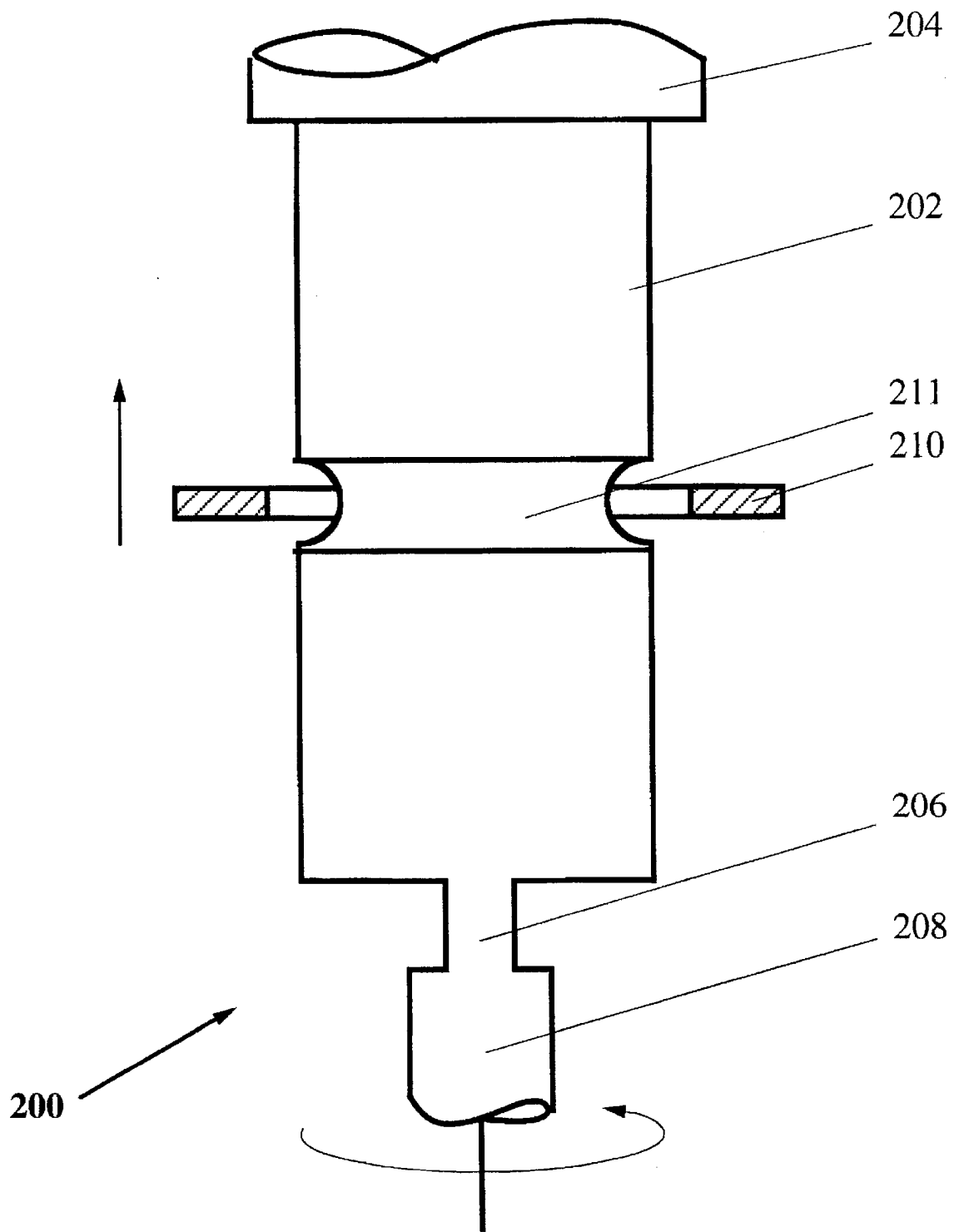
FIG. 2 illustrates a conventional apparatus for producing a single crystal ingot using the FZ method.

Continuing with FIG. 2, an apparatus 200 for producing a single crystal ingot using the FZ method is shown. In the FZ method a rod of cast polycrystalline silicon 202 is held in a vertical position by a first holder 204 and slowly rotated. A seed crystal 206 is placed in contact with the bottom of rod 202 and is hold in place by second holder 208. A radio-frequency induction heating coil 210 is slowly passed from seed crystal 206 along rod 202 from bottom to top. This causes a melted zone 211 to start at seed crystal 206 and to move along rod 202, which produces a purified and uniform crystal structure.

Once a single crystal ingot has been grown using either the CZ or FZ method, it is sliced into thin wafers using a diamond blade saw. Each wafer is then polished and chemically etched until a mirror-like surface is obtained. Identification marks may also added to the edge of each wafer to indicate the orientation of the crystal structure. After all of the wafers have been formed and polished, the actual planar fabrication process begins.

Figure 3:
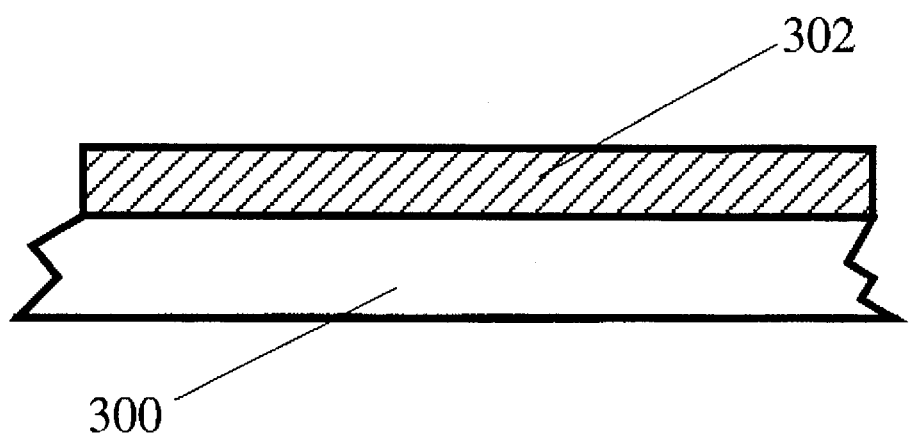
FIG. 3 shows a heavily doped p-type substrate wafer upon which a lightly doped n-type epitaxial layer 302 has been grown.

Referring now to FIGS. 3 and 4(a)-4(j), the steps for constructing an exemplary n-channel junction field-effect transistor (JFET) using the silicon planar process are now discussed. Referring first to FIG. 3, construction of the JFET begins with obtaining a heavily doped p-type substrate wafer 300, upon which a lightly doped n-type epitaxial layer 302 is grown. To grow epitaxial layer 302, substrate wafer 300 is placed in a chamber which is heated to a temperature of 900 to 1250 degrees Centigrade. A gas such as silane or silicon tetrachloride is passed over the surface of substrate wafer 300, and the gas decomposes on the surface of wafer 300 thereby depositing a layer of silicon. More particularly, the depositing silicon atoms form covalent bonds with the substrate atoms and thus extend the single-crystal lattice of substrate wafer 300 to form epitaxial layer 302. An n-type dopant-containing gas such as phosphine is simultaneously introduced into the chamber for adding n-type dopant atoms to epitaxial layer 302.

Figure 4A:
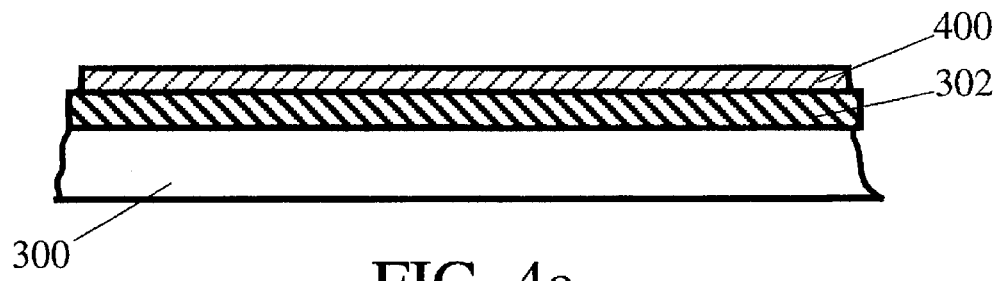
FIGS. 4(a)-4(j) are a sequence of diagrams illustrating the construction of an n-channel junction field-effect transistor (JFET) using the conventional silicon planar process.

Continuing with FIG. 4(a), the first step of the planar process is the growth of a first oxide layer 400 of about 20 nanometers to 1 micrometer in thickness on the surface of epitaxial layer 302. Oxide layer 400 may be grown either by thermal oxidation or deposition, with thermally grown oxides generally of a higher quality than deposited oxides. In order to maintain the stability of the electrical properties of the interface between epitaxial layer 302 and oxide layer 400, the numbers of organic or metallic impurities on the surface of epitaxial layer 302 and in oxide layer 400 must be kept to a minimum.

Oxide layer 400 is formed by placing substrate wafer 300 inside a resistance-heated furnace having a temperature in the range of 850 to 1100 degrees Centigrade. The oxidizing agent can be dry oxygen or it can contain water mist or fog, with oxidation proceeding more rapidly in the latter environment. Since oxidation takes place at the silicon-silicon dioxide interface, the oxidizing agent must diffuse through any previously formed oxide and then react with the silicon surface. In fact, for lower temperatures and thinner oxides, the oxide thickness is a linear function of the oxidation time. However, at higher temperatures and for thicker oxides, the oxide thickness is proportional to the square root of the oxidation time.

Figure 4B:
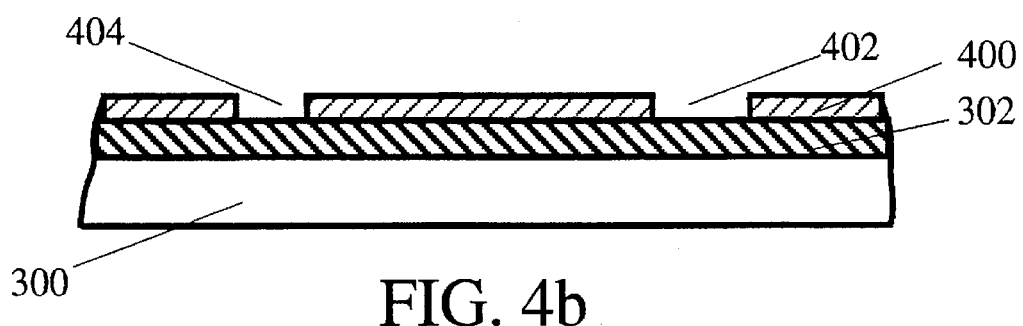

Referring now to FIG. 4(b), after oxide layer 400 has been formed on the surface of epitaxial layer 302, selective etching of oxide layer 400 is performed to create openings 402 and 404. The selective etching is accomplished using a light-sensitive polymer material called a resist, in a process called photolithography. Specifically, oxide layer 400 is lightly coated with a liquid resist (not shown) and then the resist is dried. A first photomask (not shown) is then placed on the resist and aligned using a microscope. The first photomask and resist are then exposed to ultraviolet light, which changes the chemical structure of the portions of the resist which are not shielded by the photomask. Finally, the exposed portions of the resist are then selectively dissolved using a solvent such as trichloroethylene.

Continuing with FIG. 4(b), after the photomask pattern has been formed in the resist, the unprotected portions of the oxide layer 400 are chemically etched to transfer the pattern to form openings 403 and 404. The chemical etching may be accomplished by dissolving the unprotected portions of oxide layer 400 using hydrofluoric acid, resulting in the exposure of corresponding portions of epitaxial layer 302. The resist is then removed from the remaining portions of oxide layer 400 by "ashing", in which the resist is burned off in a plasma chamber under vacuum.

Figure 4C:
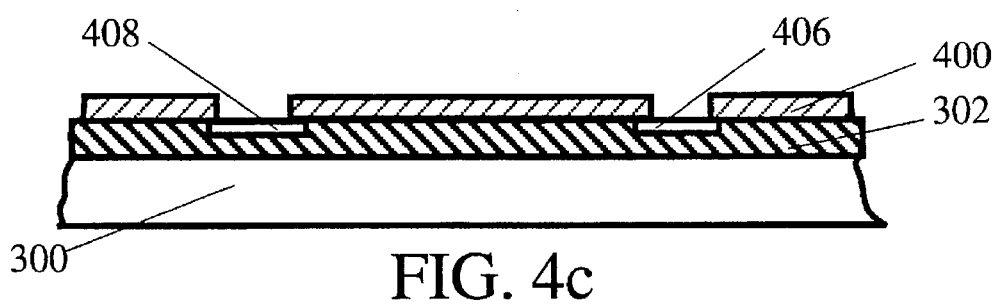

Referring to FIG. 4(c), once the remaining portions of the resist have been removed, n-type dopant atoms are added to the exposed portions of epitaxial layer 302, to form n-type regions 406 and 408. The dopant profile of regions 406 and 408 is primarily determined by steps three and four of the planar process. In step three, the dopant atoms are placed on or near the surface of epitaxial layer 302 by liquid coating, ion implantation or gaseous deposition. The fourth step involves transporting the dopant atoms into epitaxial layer 302 using a process called drive-in diffusion. Note that the shape of the resulting dopant distribution is determined by the method of dopant placement, while the diffusion depth depends primarily on the temperature and time of the drive-in diffusion.

Figure 4D:
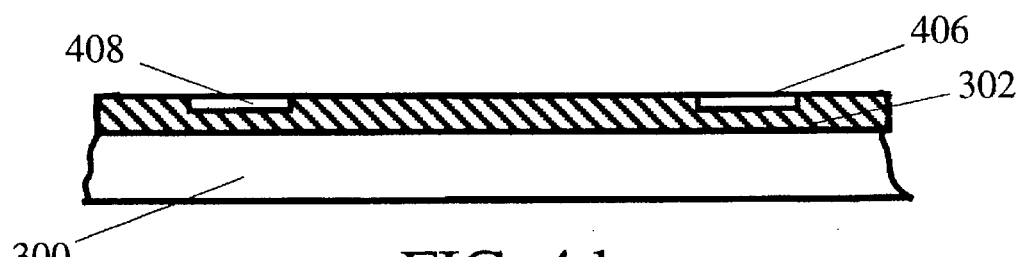
Figure 4E:
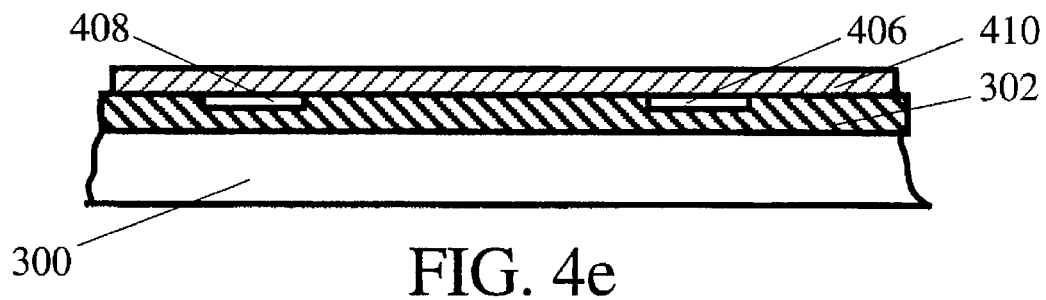

After regions 406 and 408 have been formed in epitaxial layer 302, oxide layer 400 is chemically removed by etching with hydrofluoric acid, as shown in FIG. 4(d). Next, a second oxide layer 410 is formed by again placing substrate wafer 300 inside a resistance-heated furnace having a temperature in the range of 850 to 1100 degrees Centigrade. As before, the oxidizing agent can be dry oxygen or it can contain water mist or fog, With oxidation proceeding more rapidly in the latter environment.

Figure 4F:
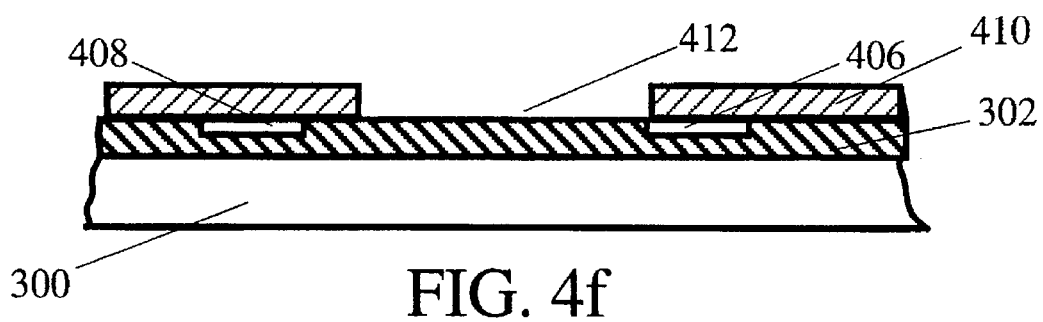

Referring now to FIGS. 4(f), once oxide layer 410 has been formed on the surface of epitaxial layer 302, selective etching is performed to create opening 412. As described in connection with the etching of oxide layer 400, oxide layer 410 is lightly coated with a liquid resist (not shown) and then the resist is dried. A second photomask (not shown) is then placed on the resist and aligned using a microscope. The second photomask and resist are then exposed to ultraviolet light, which changes the chemical structure of the portions of the resist which are not shielded by the photomask. Finally, the exposed portions of the resist are then selectively dissolved using a solvent such as trichloroethylene.

Continuing with FIG. 4(f), after the photomask pattern has been formed in the resist, the unprotected portion of oxide layer 410 is chemically etched to transfer the pattern to form opening 412. The chemical etching may be accomplished by dissolving the unprotected portions of oxide layer 410 using hydrofluoric acid, resulting in the exposure of the underlying portion of epitaxial layer 302. The resist is then removed from the remaining portions of oxide layer 410, again by ashing under vacuum.

Figure 4G:
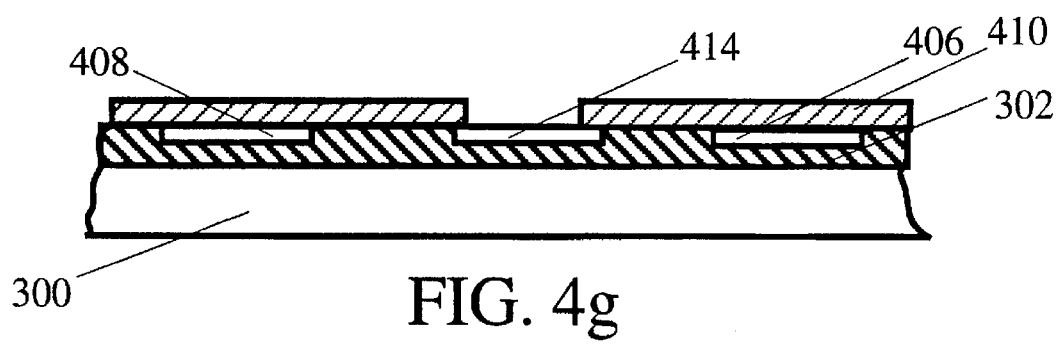

Referring now to FIG. 4(g), once the remaining portions of the resist have been removed, p-type dopant atoms are added to the exposed portion of epitaxial layer 302, to form an p-type region 414. As described above, the shape of the resulting dopant distribution is determined by the method of dopant placement, while the diffusion depth depends primarily on the temperature and time of the drive-in diffusion. Note also that the shapes of the dopant distributions for n-type regions 406 and 408 are also changed during this process.

Figure 4H:
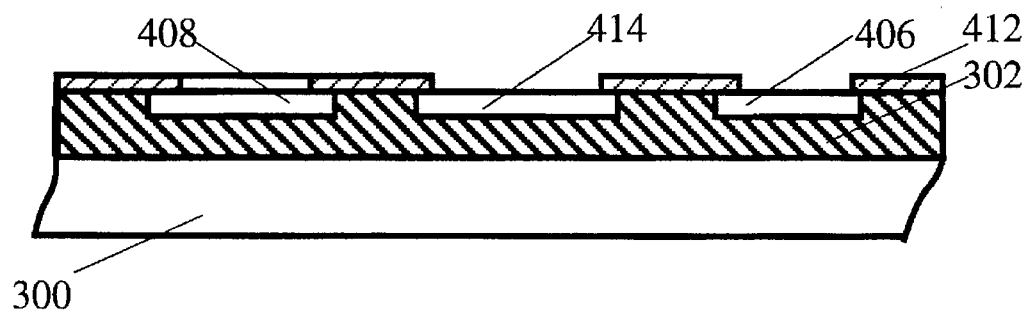

Referring now to FIG. 4(h), once p-type region 414 has been formed on the surface of epitaxial layer 302, selective etching is performed to re-expose heavily-doped n-type regions 406 and 408. Once again, oxide layer 410 is lightly coated with a liquid resist (not shown) and then the resist is dried. A third photomask (not shown) is then placed on the resist and aligned using a microscope. The third photomask and resist are then exposed to ultraviolet light, which changes the chemical structure of the portions of the resist which are not shielded by the photomask. The exposed portions of the resist are then selectively dissolved using trichloroethylene.

After the photomask pattern has been formed in the resist, the unprotected portions of oxide layer 410 are chemically etched to transfer the pattern to expose regions 406 and 408. The chemical etching may be accomplished by dissolving the unprotected portions of oxide layer 410 using hydrofluoric acid, resulting in the exposure of the underlying portion of epitaxial layer 302. The resist is again removed from the remaining portions of oxide layer 410, once again by ashing under vacuum.

Figure 4I:
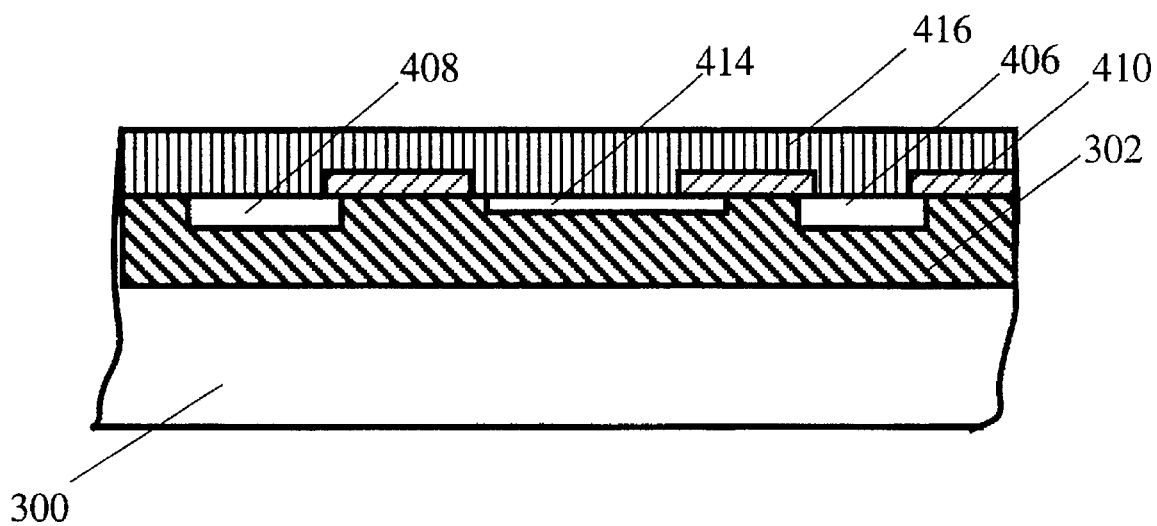
Figure 4J:
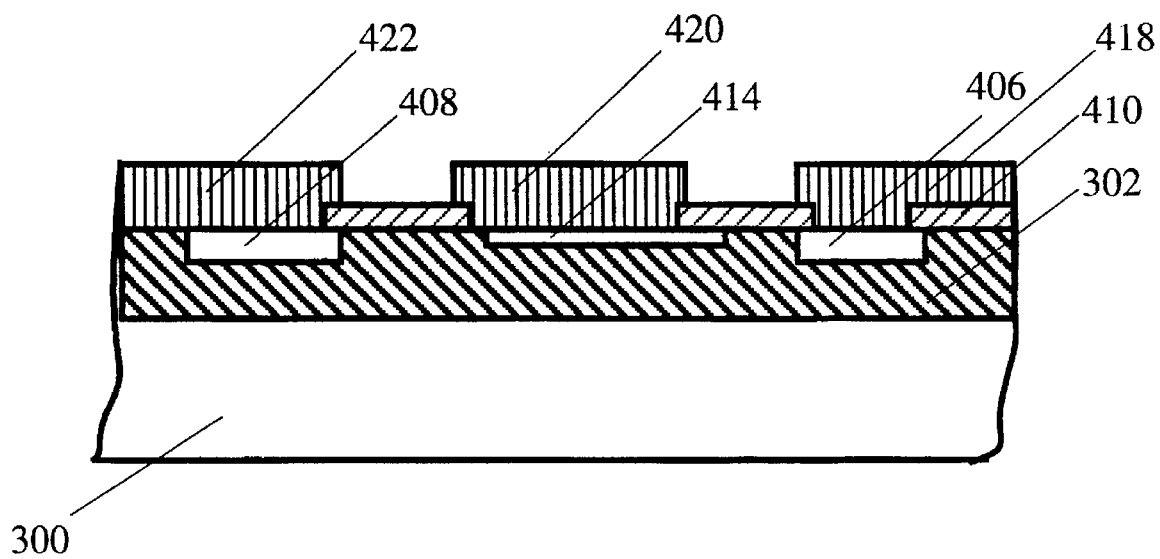

Continuing with FIG. 4(i), after oxide layer 410 has been chemically etched to expose regions 406 and 408, a metal layer 416 is deposited over the surface of oxide 410 and regions 406, 408 and 414. The deposition of metal layer 416 is performed by sputtering in a low pressure chamber. Referring to FIG. 4(j), metal layer 416, which usually consists of aluminum or an aluminum alloy, is then removed from areas where it is not desired by photolithography and etching operations similar to those already described.

As an alternative to the above-described photlithography steps which uses ultraviolet light, electron-beam lithography may be used which focuses a stream of electrons to deliver exposure energy to the resist. More particularly, the electron beam is deflected to expose the desired pattern sequentially, so that a mask is not needed. In order to control the deflection, the information needed to deflect the electron beam is stored in a computer. Additionally, the electron beam can be finely focused to a size much smaller than the minimum feature size an moved across the surface of the wafer, or the beam can be formed into a rectangular shape and the pattern built up by repeated block-like exposures.

A key concern throughout the above fabrication process is in eliminating contamination. Indeed, most of the fabrication steps described above are performed in a "clean room" environment in which the number of airborne contaminants are carefully controlled and measured in terms of parts per million (PPM). However, an important source of contamination are the materials and by-products used during the fabrication process, particularly during the conventional or electron-beam photolithography steps, which cannot be controlled using only clean room techniques.

The fabrication of modern very large scale integrated (VLSI) circuits often requires 10 to 25 photolithography steps similar to those described above. Between each of these steps, the photoresist must be completely removed, otherwise, it will contaminate the next fabrication step. However, the ashing step that is used to remove the photoresist after etching leaves a very, small amount of residue or ash on the surface of the wafer. The residue or ash can become a source of organic contamination during the next fabrication step.

A particular problem arises when using electron-beam lithography. The energy levels present in the electron beam will decompose chemical structure of the resist, making it very difficult to remove using only chemical processes. Ashing is again used to remove the decomposed resist. However, the organic residue will remain and may contaminate the next fabrication step.

Figure 5:
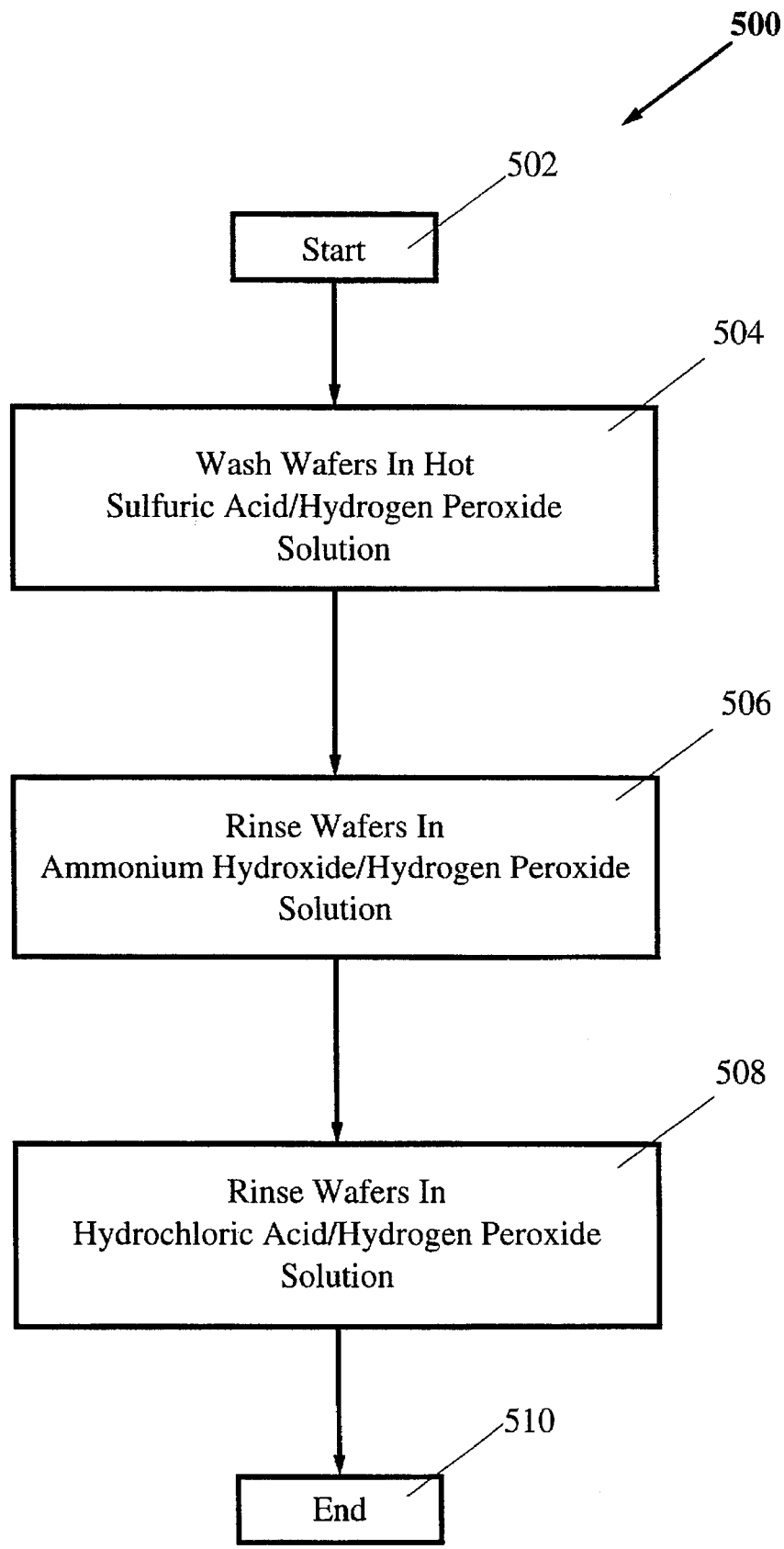
FIG. 5 is a flow chart illustrating the steps of a conventional process for drying integrated circuit wafers during the silicon planar process.

In order to control this type of organic contamination, after photolithography and ashing the wafer being fabricated is cleaned using the cleaning process 500 shown in FIG. 5. Process 500 begins at step 502 after which a hot sulfuric acid/hydrogen peroxide wash is used to remove organic contamination (e.g., the photoresist residue) in step 504. The hot sulfuric acid/hydrogen peroxide wash is followed by an ammonium hydroxide/hydrogen peroxide rinse in step 506 to remove non-metallic and organic particles, and then a hydrochloric acid/hydrogen peroxide rinse in step 508 is used to remove any metallic particles introduced by the high pH (approximately 12) of the ammonium hydroxide/hydrogen peroxide rinse. Process 500 ends at step 510.

In cleaning process 500, the hot sulfuric acid/hydrogen peroxide wash is performed at a temperature of between 120 and 160 degrees Celsius in a special quartz vessel. However, quartz is extremely fragile and is subject to very high internal stress during fabrication, particularly while experiencing ultrasonic vibration. Ultrasonic vibration may be required to completely remove the contamination remaining on the wafer surface following ashing. Additionally, the inner surface of the quartz vessel may contain an organic film which can find its way into the acid and eventually onto the wafers. The time required to remove this organic film, coupled with the high cost and limited service life of the vessel, are important limiting factors in the overall throughput of the fabrication process.

Another key concern during the fabrication process is adequate drying of the wafers between wet process steps. Historically, most drying was done using spin rinse dryers. However, the trend toward larger and/or thinner wafers has precluded the use of spinning. Additionally, IPA dryers provide superior cleaning while avoiding the problem of electrostatic charging which can occur when spinning a conventional wafer boat.

Figure 6:
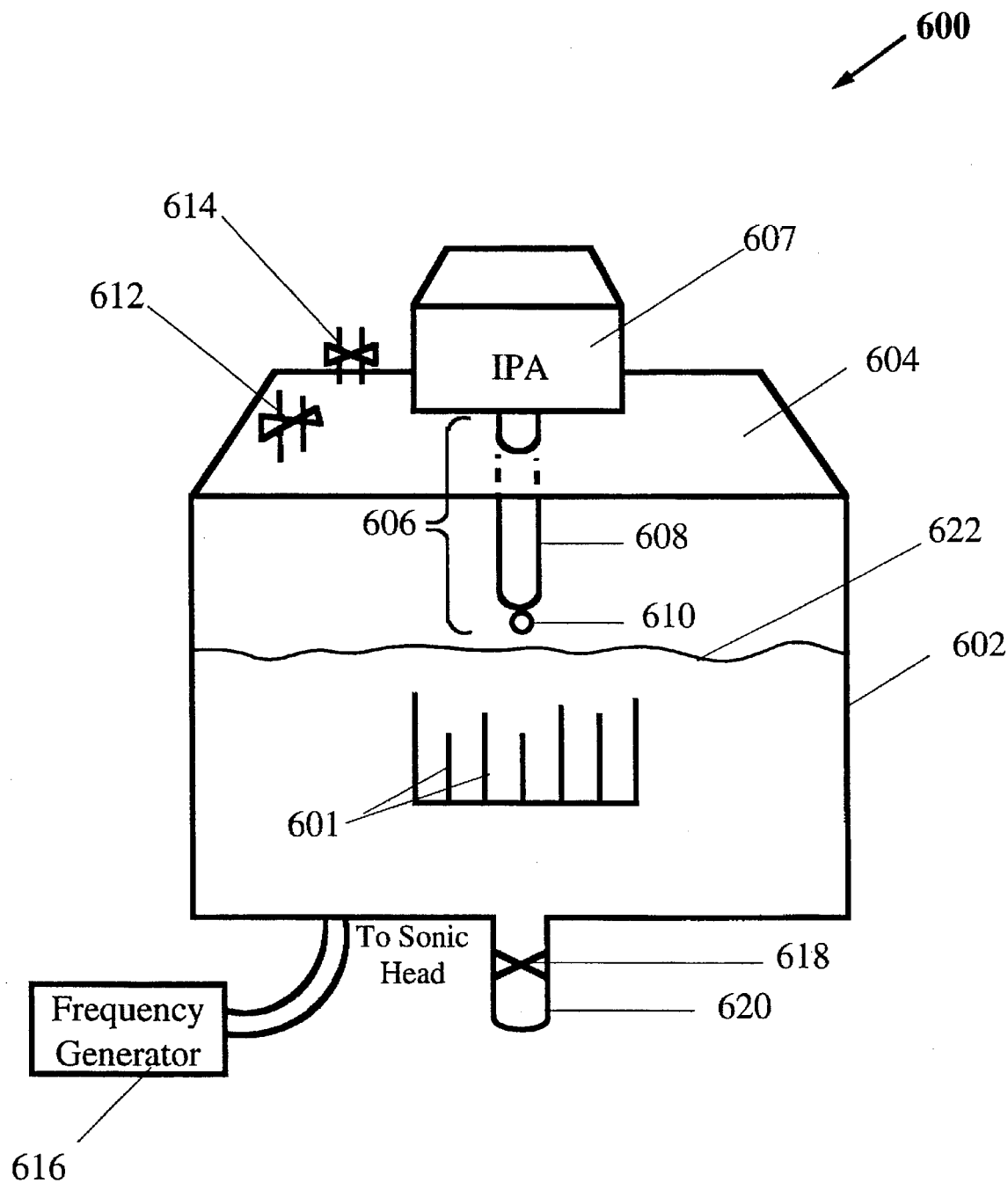
FIG. 6 illustrates an apparatus constructed in accordance with the present invention for drying integrated circuit wafers during the silicon planar process.

Referring now to FIG. 6, an apparatus 600, constructed in accordance with the present invention for drying the wafers during fabrication is shown. Apparatus 600 includes a drying chamber housing 602, constructed of stainless steel or similar material, and a lid 604 for providing access to chamber 602. Although not critical to the function of apparatus 600, in the preferred embodiment a drying chamber working volume 603 may be cylindrical in shape and may have a volume capacity of 15 to 35 liters.

A sonic head and nozzle assembly 606, including a sonic head 608 and a low-velocity nozzle 610, is attached to lid 604 so that nozzle 610 protrudes into the drying chamber. Sonic head 608 is coupled to a pressurized IPA source 607, which is pressurized by low-pressure nitrogen. Also attached to lid 604 are valves 612 and 614 for introducing ambient temperature nitrogen for purging drying chamber 602, and hot nitrogen for drying the wafers.

A frequency generator or oscillator 616 is electrically coupled to the sonic head 608 for causing the latter to vibrate at a selected frequency. In the preferred embodiment, the output frequency of frequency generator 616 is set to about 100 kilohertz.

An adjustable flowmeter 618 and a drain 620 is attached to the bottom of drying chamber 602 for introducing and removing de-ionized water to and from drying chamber 602.

Figure 7:
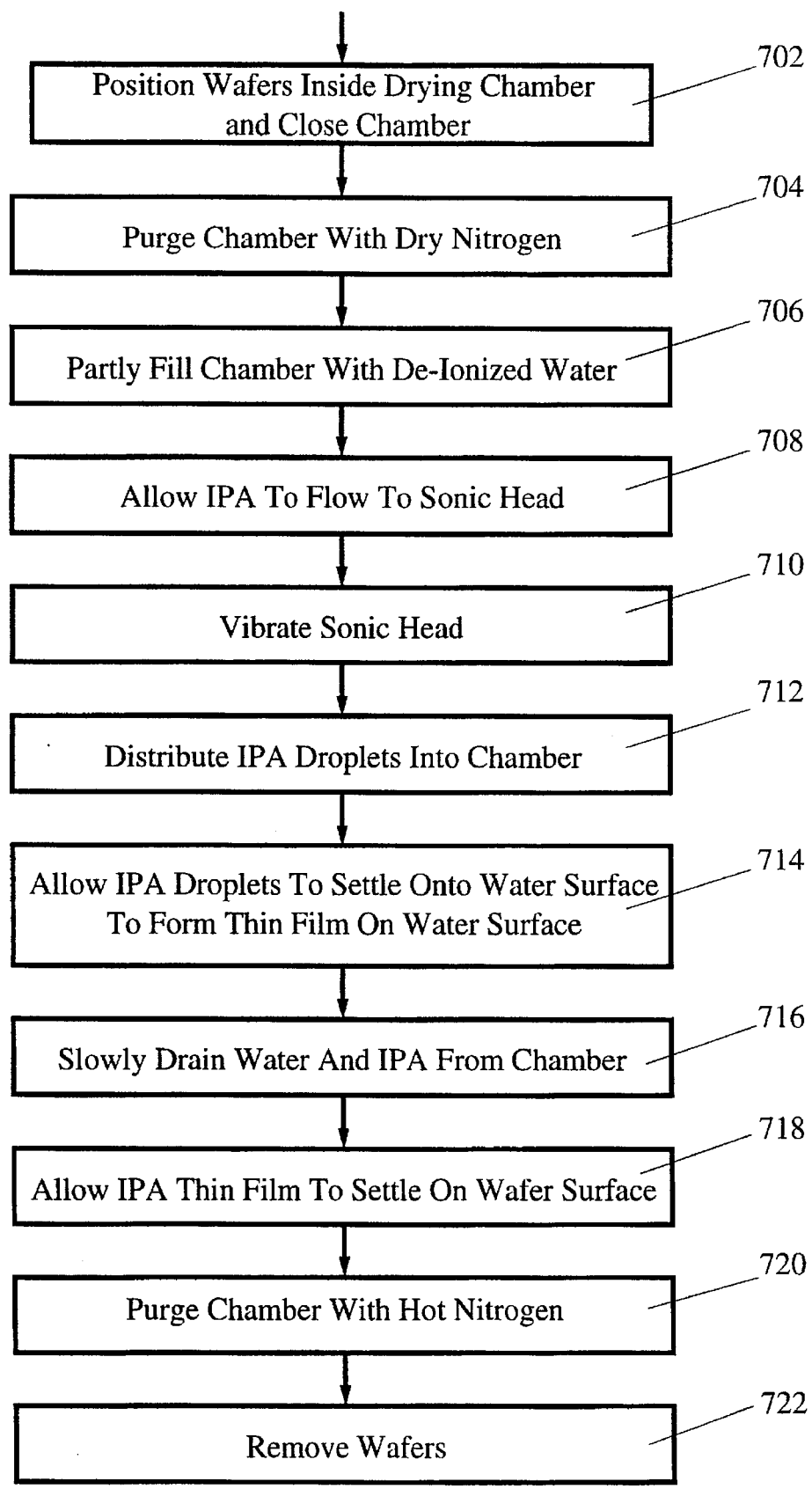
FIG. 7 is a flow chart illustrating a sequence of method steps that can be carried out using the apparatus of FIG. 6, according to the invention.

Continuing with FIG. 7, the apparatus in FIG. 6 may be operated as follows. First, the wafers 601 to be dried are placed inside the drying chamber volume 603 and the chamber is closed, in step 702. The surfaces of the wafers are oriented vertically, using a conventional quartz wafer boat. The drying chamber volume 603 is then flooded with dry nitrogen in step 704, which purges the chamber of any airborne contaminants or other particles. The drying chamber volume 603 is then filled with ultrapure, de-ionized water, in step 706, to a level 622 (FIG. 6) that just covers the top edges of the wafers.

Once the wafers have been immersed in the de-ionized water, a drying fluid, in this instance, isopropyl alcohol (IPA) flows to the sonic head, which is attached to and extends through some wall of the drying chamber, in step 708. The sonic head 608, which can vibrate at various frequencies, is preferably vibrated, in step 710, at a frequency of about 11 kilohertz, thereby producing an IPA mist or fog of ultrafine droplets, preferably having an average diameter of about 20 microns. The vibration frequency can change with sonic head design, as well as with drying fluid. The low velocity nozzle 610 then distributes the ultrafine droplets into the drying chamber volume 603, in step 712, where the droplets settle onto the exposed surface of the de-ionized water, in step 714.

In fact, the manner in which the ultrafine droplets are distributed into drying chamber 602 is very important to the drying process. More particularly, the size, velocity and distribution of the droplets must be carefully controlled in order to build a non-mixing layer of the drying liquid, in this instance the IPA film on the surface of the de-ionized water. Thus, the sonic head and nozzle should produce ultrafine droplets having a low velocity, which can be controlled with a low-velocity gas jet.

As the drying fog or mist, in this instance IPA, is formed, the fog settles onto the exposed surface of the de-ionized water and forms a film which partially diffuses into the water, in step 714. he flow velocity of the drying liquid onto the de-ionized water exposed surface must be great enough to build the film faster than the IPA diffuses into the water. Once the IPA film is built and maintained, the de-ionized water is slowly drained from the drying chamber volume 603, in step 716, so that the film of drying liquid is pulled onto the surfaces of the wafers, in step 718, as the water and IPA mixture drains from the drying chamber volume 603. More particularly, the low surface tension of the IPA film in this instance forces the de-ionized water from the surface of the wafers in a uniform sheet, leaving only a small amount of IPA film on the surfaces of the wafers.

After the de-ionized water has been completely drained from drying chamber 602, hot nitrogen is introduced into drying chamber volume 603, in step 720, to remove any remaining IPA film. The wafers are then removed from the drying chamber volume 603, in step 722, and conventional wet processing continues.

The invention can dry a single wafer or other object, but drying a number of objects or wafers is more practical and efficient. The invention, however, can be utilized for the drying of a single article or object, if necessary due to size or process needs.

An alternative embodiment does not require the use of hot nitrogen at the end of the process (step 720), once the present invention is used in a clean room environment found in the semiconductor processing industry. Elimination of this hot nitrogen step eliminates the need for use of nitrogen and for use of a nitrogen heater. Many, however in the semiconductor industry, may chose to use the step of hot nitrogen at the need of the process as more of a psychological safeguard to ensure complete drying.

An important advantage of the present invention is that the use of an IPA fog or mist at low temperatures, such as at room temperature, reduces both the risk of fire and the complexity of the drying system. Another advantage of the present invention is that reduced amounts of chemicals are used during the drying process, thereby providing an overall reduced cost of operation.

The embodiments disclosed above are directed towards the processing and cleaning of integrated circuit wafers and the like. Clearly, the above method and apparatus is useful in the processing and drying of component parts such as optical lenses, microelectronic components, such as circuit boards and the like, medical instruments, automotive component parts, such as fuel injectors and other complex configured parts, aerospace parts, flat panel display components and any like industries where drying and cleanliness of complex configured parts or any component part are a concern. The invention can be easily embodied for the uses for the component parts and related industries noted in the preceding sentence.

Further, the drying liquid could be any liquid that has a surface tension lower than the surface tension of the of the de-ionized water or whatever fluid is used to fill the chamber to accomplish the drying. For semiconductor processing the chamber is filled with de-ionized and de-oxygenated water, but the chamber could be filled with other liquid, depending on the application, having a higher surface tension relative to the surface tension of the drying liquid.

Another alternative embodiment of the current invention would provide a single chamber for cleaning and drying, wherein the wafers or objects can be positioned, cleaned, and then dried in a single chamber.

The foregoing description includes what are at present considered to be preferred embodiments of the invention. It will be readily apparent to those skilled in the art that various changes and modifications may be made to the embodiments without departing from the spirit and scope of the invention. For example, the method and apparatus of the present invention may be used with other types of integrated circuit processing, such as in the fabrication of gallium arsenide integrated circuits. Accordingly, it is intended such changes and modifications fall within the spirit and scope of the invention, and that the invention be limited only by the following claims.

What is claimed is:

1. A method for drying objects, the method comprising the steps of:

enclosing objects to be dried in a closeable chamber;

introducing into the chamber a draining liquid to cover the objects and to form an exposed surface;

introducing a drying liquid into the chamber through a sonic head and creating droplets of the drying liquid;

allowing the droplets of drying liquid to form a film on the exposed surface of the draining liquid; and draining the drying liquid and the draining liquid from the chamber.

2. The method of claim 1, further comprising the step of introducing a non-reactive gas into said chamber to purge said chamber before introduction of at least one of said draining liquid and said drying liquid.

3. The method of claim 2, further comprising the step of selecting said non-reactive gas to be nitrogen.

4. The method of claim 1, further comprising the step of introducing a non-reactive gas into said chamber during the time said drying liquid and said draining liquid are being drained from said chamber.

5. The method of claim 4, further comprising the step of selecting said non-reactive gas to be nitrogen.

6. The method of claim 1, further comprising the step of introducing a non-reactive gas into said chamber after said drying liquid and said draining liquid are drained from said chamber.

7. The method of claim 6, further comprising the step of selecting said non-reactive gas to be nitrogen.

8. The method of claim 1, further comprising the step of selecting said drying liquid to have a lower surface tension than a surface tension of said draining liquid.

9. The method of claim 1, further comprising the step of selecting said drying liquid to be isopropyl alcohol.

10. The method of claim 1, further comprising the step of selecting said draining liquid to be water.

11. The method of claim 1, further comprising the step of selecting said draining liquid to be de-ionized.

12. The method of claim 1, further comprising the step of selecting said draining liquid to be deoxygenated.

* * * * *

UNITED STATES PATENT AND TRADEMARK OFFICE
CERTIFICATE OF CORRECTION

PATENT NO. : 5,653,045
DATED : August 5, 1997
INVENTOR(S) : Gary W. Ferrell

It is certified that error appears in the above-identified patent and that said Letters Patent is hereby corrected as shown below:

Column 3, line 55, through column 4, line 8, should read as following:

-- After cleaning, the wafer is dried using either a conventional spin rinse dryer (SRD) or isopropyl alcohol (IPA) vapor. In particular, conventional IPA vapor systems are capable of producing a wafer having a very dry surface finish and very low particle contamination count. For the drying process, the wafer is transferred from the cleaning vessel to a self-contained drying module. A pressurized IPA stream is directed to a heated plate which is located in the drying module, in order to produce a hot IPA vapor which dries the wafer. However, the hot IPA vapor produced by the stream and hot plate is highly flammable, thus requiring special safety precautions to avoid fires.

UNITED STATES PATENT AND TRADEMARK OFFICE
CERTIFICATE OF CORRECTION

PATENT NO.  : 5,653,045
DATED       : August 5, 1997
INVENTOR(S) : Gary W. Ferrell It is certified that error appears in the above-identified patent and that said Letters Patent is hereby corrected as shown below:

Accordingly, there is a need for a method and apparatus for drying wafers during the production of integrated circuits which does not require the use of a self-contained drying module, which does not result in flammable vapor, which reduces the usage of expensive chemicals and in which ultrasonic vibrations are used to improve the efficiency and increase the throughput of the overall drying process. - -

Signed and Sealed this

Thirteenth Day of January, 1998

Attest:

*Attesting Officer*

BRUCE LEHMAN
*Commissioner of Patents and Trademarks*